(12) United States Patent
Kaertner et al.

(10) Patent No.: US 8,704,198 B2
(45) Date of Patent: Apr. 22, 2014

(54) EFFICIENT HIGH-HARMONIC-GENERATION-BASED EUV SOURCE DRIVEN BY SHORT WAVELENGTH LIGHT

(75) Inventors: Franz X. Kaertner, Newton, MA (US);
Edilson L. Falcao-Filho, Recife (BR);
Chien-Jen Lai, Cambridge, MA (US);
Kyung-Han Hong, Lexington, MA (US); Tso Yee Fan, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 181 days.

(21) Appl. No.: 12/966,574

(22) Filed: Dec. 13, 2010

(65) Prior Publication Data

US 2011/0140009 A1    Jun. 16, 2011

Related U.S. Application Data

(60) Provisional application No. 61/286,347, filed on Dec. 14, 2009.

(51) Int. Cl.
*G02F 1/37*    (2006.01)

(52) U.S. Cl.
USPC .................................................. 250/504 R

(58) Field of Classification Search
USPC .................................................. 250/504 R
See application file for complete search history.

(56) References Cited

U.S. PATENT DOCUMENTS

| | | | |
|---|---|---|---|
| 5,963,359 A | 10/1999 | Shinozaki et al. | |
| 6,968,038 B2 | 11/2005 | Nam et al. | |
| 7,391,850 B2 | 6/2008 | Kaertner et al. | |
| 2002/0172235 A1 | 11/2002 | Chang et al. | |
| 2006/0268949 A1 | 11/2006 | Gohle et al. | |
| 2008/0030876 A1* | 2/2008 | Kataoka et al. | 359/719 |
| 2008/0069171 A1 | 3/2008 | Rocca et al. | |
| 2008/0137696 A1 | 6/2008 | Zhang et al. | |
| 2010/0207034 A1* | 8/2010 | Moiseyev et al. | 250/393 |
| 2011/0013653 A1* | 1/2011 | Krausz et al. | 372/22 |

OTHER PUBLICATIONS

Kim et al. 'Highly Efficient High-Harmonic Generation in an Orthogonally Polarized Two Color Laser Field' Jun. 21, 2005, Physical Review Letters, vol. 94, p. 293901.*

Gutierrez-Vega et a;. 'Bessel-Gauss Resonator with Spherical Output Mirror Geometrical and Wave-Optics Analysis' Nov. 2003, Jo. Opt. Soc. Am. A, vol. 20, No. 11, p. 2113-2122.*

Caron et al. 'Phase Matching and Harmonic Generation in Bessel-Gauss Beams' Mar. 1998, J. Opt. Soc. Am. B, vol. 15, No. 3, p. 1096-1106.*

Korean Intellectual Property Office, International Search Report and Written Opinion for PCT/US2010/060101 (PCT application corresponding to the present US application) (Nov. 14, 2011).

(Continued)

*Primary Examiner* — Michael Logie
*Assistant Examiner* — Eliza Osenbaugh-Stewart
(74) *Attorney, Agent, or Firm* — Modern Times Legal; Robert J. Sayre

(57) ABSTRACT

Extreme ultraviolet radiation is generated based on high-order harmonic generation. First, a driver pulse is generated from a drive laser. Second, the infrared driver pulse is passed through a second harmonic generator with an output wavelength in the range from 400 to 700 nm. Third, the pulse is then passed through a gas medium, which can be inside a resonant cavity, to generate a high-order harmonic in the form of extreme ultraviolet radiation.

13 Claims, 8 Drawing Sheets

(56) References Cited

OTHER PUBLICATIONS

Moll, Kevin D., et al., "Output coupling methods for cavity-based high-harmonic generation", Optics Express, vol. 14, No. 18 (Sep. 4, 2006), pp. 8189-8197.

Gohle, Christoph, et al., "A frequency comb in the extreme ultraviolet", Nature, vol. 436 (Jul. 14, 2005), pp. 234-237.

Falcao-Filho, Edilson L., et al., "Scaling of high harmonic generation efficiencies with 400-nm and 800-nm driver pulses", Conference on Lasers and Electro-Optics (CLEO) 2010 (May 16, 2010), pp. 1-3.

Yost, D. C., et al., "Efficient output coupling of intracavity high-harmonic generation", Optics Letters, vol. 33, No. 10 (May 15, 2008), pp. 1099-1101.

Jones, R. J., et al., "Phase-Coherent Frequency Combs in the Vacuum Ultraviolet via High-Harmonic Generation inside a Femtosecond Enhancement Cavity", Physical review letters (PRL 94, 193201) (May 20, 2005), pp. 1-4.

Hong, Kyung-Han, et al., "High-energy, picosecond, cryogenic Yb:YAG chirped-pulse amplifier at kHz repetition rates for OPCPA pumping", Conference on Lasers and Electro-Optics (CLEO) 2010 (May 21, 2010), pp. 1-2.

Huang, Shu-Wei, et al., "Ultrabroadband Optical Parametric Chirped Pulse Amplifier System for Single-Cycle Waveform Synthesis", Lasers and Electro-Optics (CLEO) and Quantum Electronics and Laser Science Conference (QELS) 2010 (May 21, 2010), pp. 1-2.

Gkortsas, Vasileios-Marios, et al., "High Efficiency High Harmonic Generation Based EUV Sources", Optical Society of America (2009), pp. 1-2.

Putnam, William P., et al., "High-Intensity Bessel-Gauss Beam Enhancement Cavities", Conference on Lasers and Electro-Optics, OSA Technical Digest (CD) (Optical Society of America) 2010 (May 16, 2010), pp. 1-2.

\* cited by examiner

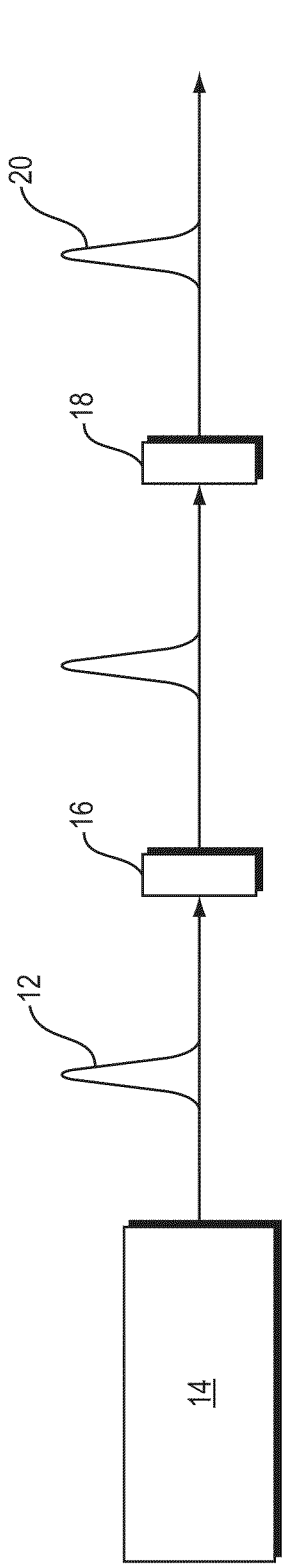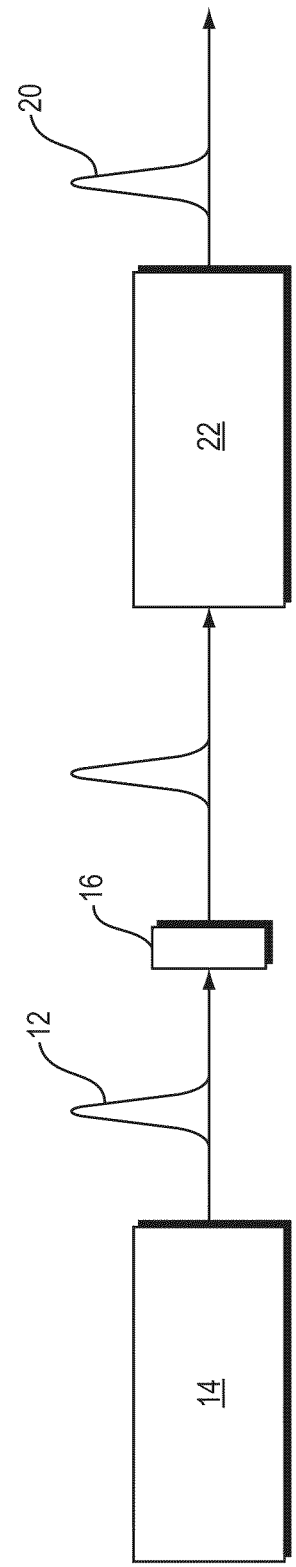

EFFICIENT HIGH-HARMONIC-GENERATION-BASED EUV SOURCE DRIVEN BY SHORT WAVELENGTH LIGHT

RELATED APPLICATION

This application claims the benefit of U.S. Provisional Application No. 61/286,347, filed 14 Dec. 2009, the entire content of which is incorporated herein by reference.

GOVERNMENT SUPPORT

The invention was supported, in whole or in part, by a grant under Contract Number FA9550-08-1-0409 from the Air Force Office of Scientific Research and the Defense Advanced Research Projects Agency. The Government has certain rights in the invention.

BACKGROUND

When a medium is illuminated by intense short pulses at some field strength, the medium is ionized and the electrons are accelerated in one half cycle of the field. Some of these electrons return back to the parent atom or molecule from which they originated and re-interfere with that part of the electron wavefunction that was not yet ionized, leading eventually to recombination of the accelerated electron under emission of an extreme ultraviolet (EUV or XUV) photon equivalent in energy to the sum of ionization energy and kinetic energy accrued during acceleration in the field. These energies typically cover the EUV to soft x-ray wavelength range from 10 eV to 1 keV and eventually even up to 10 keV. This process was named high-order harmonic generation (HHG).

Thus far, HHG has been thought to be a relatively inefficient generation process with efficiencies typically in the range of $10^{-6}$ to $10^{-8}$ or even less for energies above 45 eV. In the range below 40 eV, efficiencies of $10^{-5}$ were demonstrated in heavy gases such as Ar and Xe; but, in this range, the possibility of applications are limited.

Previous HHG studies were pursued with titanium (Ti): sapphire lasers at 800 nm because those lasers enable the generation of the shortest pulses directly from laser-based oscillators and amplifiers. For fundamental studies, sometimes the second harmonic of Ti:sapphire, 400 nm light, or a combination of 400 and 800 nm light was used. More recently, to demonstrate very-short wavelength EUV generation, longer wavelength driver pulses with wavelengths of 1.6 micron and even 2 micron have been used or proposed.

Current technology for EUV sources for EUV lithography is based either on discharge-produced plasma (DPP) sources or laser-produced plasma (LPP) sources. It is expected that the first generation of EUV-lithography production tools will likely use LPP sources. For future technologies, it is thought likely that the source power requirements will even increase to more than 500 W. Current source demonstrations for both DPP and LPP sources are below 50 W.

EUV source readiness is still seen as the major risk to introducing EUV lithography. In addition, LPP sources have the undesired effect of debris production damaging the source optics. Also, both DPP and LPP sources are not spatially coherent; therefore, EUV light collection is further problematic and a source for low efficiency. In contrast, HHG sources are spatially fully coherent sources producing a well-collimated beam.

The use of passive enhancement cavities for coherent pulse addition and EUV generation was proposed in US Patent Application Publication No. 2006/0268949 A1 and demonstrations have been reported in C. Gohle, et al., "A Frequency Comb in the Extreme Ultraviolet," 436 Nature 234-37 (2005) and in R. Jones, et al., "Phase-Coherent Frequency Combs in Vacuum Ultraviolet via High-Harmonic Generation Inside a Femtosecond Enhancement Cavity," 94 Phys. Rev. Lett. 193201 (2005). However, these early studies were not for the purpose of efficiency enhancement but rather for generation of frequency combs for high-resolution laser spectroscopy at an EUV wavelength less than 50 eV. In this early work, output coupling of the EUV light from the cavity was problematic. The use of cavity mirrors with holes and the use of LP01 Laguerre Gaussian modes were tried with little apparent success.

Output coupling with a sapphire Brewster plate, which reflects the EUV but transmits the laser radiation, is currently used with the disadvantages that the plate is relatively easily damaged and the plate nonlinear index leads to undesired cavity resonance shifts. More recently, a plate with an EUV micrograting was used for output coupling, which, however, shows only a limited output coupling efficiency of 10%, D. Yost, et al., "Efficient Output Coupling of Intracavity High-Harmonic Generation," 33 Opt. Lett. 1099-1101 (2008). Another problem is damage to the cavity mirrors due to the high intensities in the HHG process.

SUMMARY

Apparatus and methods for efficient generation of extreme ultraviolet (EUV or XUV) radiation based on high-order harmonic generation (HHG) are described herein. Various embodiments of the device and method may include some or all of the elements, features and steps described below.

An efficient high-harmonic-generation-based extreme ultraviolet radiation source driven by short wavelength light comprises: a drive laser, a second harmonic generator positioned in the path of optical pulses generated by the drive laser, and an extreme ultraviolet radiation generator in the form of a gas medium, which can be in a resonant cavity, positioned in the path of the optical pulses on an opposite side of the second harmonic generator from the drive laser.

In a method for efficient generation of extreme ultraviolet radiation based on high-order harmonic generation, an infrared driver pulse is generated from a drive laser and passed through a second harmonic generator to produce an output wavelength in the range from 400 to 700 nm. The pulse is then passed through the gas medium to generate a high-order harmonic in the form of extreme ultraviolet radiation. In particular embodiments, the pulse is circulated and focused in a resonant cavity before passing a through the gas medium.

By use of a drive laser with a suitable laser wavelength as well as interaction parameters between the laser pulse and a gas and a passive or active laser cavity that enables the multiple interaction of a laser pulse with a gas jet for optimized HHG generation, the range of efficiencies of $10^{-5}$ and possibly even $10^{-4}$ can be extended up to the 100 eV range in a single-pass process. Efficiency is defined here as the ratio between the energy generated at a given harmonic of the driver pulse to the energy of the driver pulse. Moreover, considering these efficiencies of $10^{-5}$ and a passive enhancement cavity or a femtosecond laser cavity, HHG conversion efficiencies up to 10% may be achievable. The driver pulse can have an energy in the range from 100 µJ to 100 mJ.

The overall efficiency of the system can be boosted by the number of equivalent interactions of the pulse, which is equivalent to the Finesse/Pi of the cavity. Thus, the efficiency may be boosted by a factor of 100-1000 or more. Efficient generation of EUV light (which can be at wavelengths in the range of 10 nm to 120 nm; and, in a particular embodiment, at 13.5 nm) is especially important for EUV lithography currently pursued to maintain the International Technology Roadmap of for Semiconductors (ITRS). The ITRS lists EUV lithography (EUVL) as the main contender for the sub-22 nm half-pitch nodes, which is believed to not be reachable via extension of current optical lithography technologies. For production-grade technologies, EUV powers greater than 100 W are used. EUV light is also used for many other applications, such as understanding surface dynamics, structure and function of atoms and molecules, and imaging of tissue. A further advantage of the EUV generation technology, described here, is that the radiation is spatially and temporally fully coherent. Other proposed source technology, such as plasma-based sources, lack this property and in addition create debris that may damage downstream optics.

The enhancement cavity is essentially recycling the driver pulse for a multiple-pass HHG process and, therefore, boosts the efficiency by the equivalent number of roundtrips a pulse makes in a cavity before the pulse is dissipated either due to the nonlinear conversion or other cavity losses. The lack of efficient EUV sources, especially at 13.5 nm (93 eV), is currently a roadblock for the development of EUV lithography for the semiconductor industry. The technology presented here can facilitate use of EUV radiation for lithography at 13.5 nm and other wavelengths in semiconductor fabrication and for other applications.

The combination of using a high-power short-wavelength source as the HHG driver, the light noble gases (Ne and/or He) as the HHG medium generator, and the cavity enhancement technique is an advantageous radiation source for the EUV/XUV region, mainly in the spectral region of 10-100 nm, where efficiencies up to 1% can be reached.

BRIEF DESCRIPTION OF THE DRAWINGS

FIG. 1 is a schematic illustration of an apparatus for generating EUV radiation at a low repetition rate and via a single pass in a gas medium.

FIG. 2 is a schematic illustration of an apparatus for generating EUV radiation at a high repetition rate and with pulse enhancement via a resonant cavity containing a gas nozzle.

In the accompanying drawings, like reference characters refer to the same or similar parts throughout the different views. The drawings are not necessarily to scale, emphasis instead being placed upon illustrating particular principles, discussed below.

DETAILED DESCRIPTION

Figure 3:
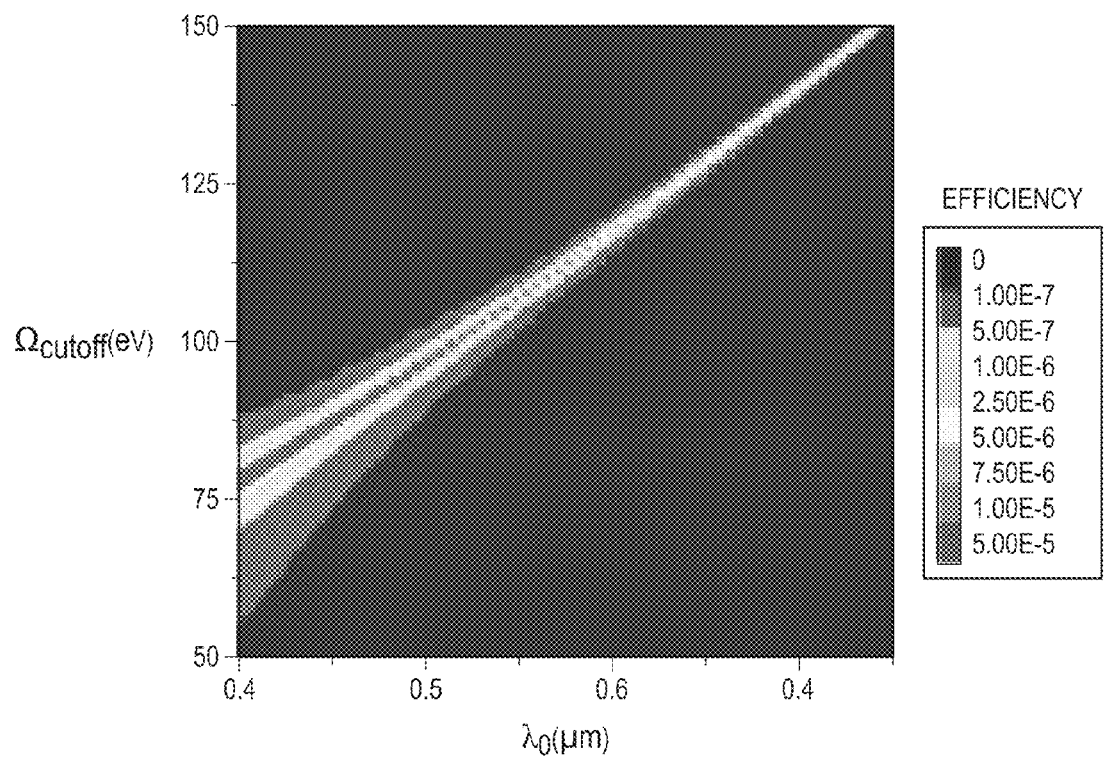
FIG. 3 is a photographic representation of HHG efficiency for helium at the cutoff frequency as a function of driving wavelength, $\lambda_0$, for 5 cycles of the driver pulse.

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, terms (including technical and scientific terms) used herein have the same meaning as commonly understood by one of ordinary skill in the art to which the invention belongs. It will be further understood that terms, unless otherwise used or characterized herein, are to be interpreted as having a meaning that is consistent with their accepted meaning in the context of the relevant art and are not to be interpreted in an idealized or overly formal sense unless expressly so defined herein. For example, if a particular composition is referenced, practical, imperfect realities may apply; e.g., the potential presence of at least trace impurities (can be understood as being within the scope of the description.

The terminology used herein is for the purpose of describing particular embodiments and is not intended to be limiting of exemplary embodiments. As used herein, the singular forms "a," "an" and "the" are intended to include the plural forms as well, unless the context clearly indicates otherwise. Additionally, the terms, "includes," "including," "comprises" and "comprising," specify the presence of the stated elements or steps but do not preclude the presence or addition of one or more other elements or steps.

In accordance with the apparatus and methods described herein, efficient high-order harmonic gain (HHG) can be achievable in the range up to 100 eV when short-wavelength driver pulses (400-750 nm) are used.

In general, the HHG spectrum exhibits a plateau, presenting harmonics with approximately the same order of magnitude in intensity, and a cutoff region. Due to the physical mechanism associated to the HHG process, which involves the production of free electrons and its acceleration by the driving field, the cutoff energy, $\hbar\omega_{cut}$, is given by the following equation:

$$\hbar\omega_{cut} = I_P + 3.17\frac{E_0^2 e^2}{4m\omega_D^2}, \quad (1)$$

where $\omega_{cut}$ is the cut off frequency; $I_p$ is the ionization energy; e and m respectively are the electron charge and mass; and $E_0$ and $\omega_D$ respectively are the driver field amplitude and frequency. For energies above the cutoff point, the HHG efficiency drops exponentially. As a consequence, the HHG spectrum is substantially determined by the cutoff, which depends on the interplay between the driving frequency and the electric field amplitude.

Thus, if the goal is to produce high-energy photons (with energies greater than 100 eV), the currently pursued route is to adjust the electric field magnitude such that there is optimized ionization for achieving phase matching and to reduce $\omega_D$ properly. If, however, the final objective is to operate a system in the range of 10-100 eV, a short driving wavelength combined with electric field magnitudes slightly higher than the ones usually used with 800-nm driver pulses can be used. Indeed, since HHG is a coherent process, in order to improve the HHG efficiency, the following three major aspects are considered: (a) the atomic response, (b) the absorption at the wavelength to be generated and (c) phase matching. The atomic response entering the HHG efficiency scales with $\lambda^{-5}$ for the cutoff region and with $\lambda^{-6}$ for the plateau region. The overall efficiency achievable is maximized when using a gas with the lowest absorption at the wavelength generated. A phase matching analysis indicates that the phase mismatch scales with the harmonic order. It is therefore advantageous to use a short wavelength driver pulse to achieve HHG at a certain wavelength to reduce the required harmonic order.

Due to ionization, the process is more efficient if short pulses are used so that the medium is subject to the highest field in the pulse before ionization significantly destroys phase matching and HHG efficiency declines. Since short-pulse lasers with high-average-power ultrashort pulses (less than 300 fs) are mostly available in the near infrared region, second harmonic generation can be used in order to obtain ultrashort high-average-power short-wavelength pulses for single-pass HHG or for multi-pass HHG using cavity enhancement techniques or other arrangements. In particular, high-power ytterbium(Yb)-based solid-state sources, such as cryogenically cooled Yb:YAG solid-state media, Yb:YLF solid-state media, and other Yb-doped solid-state media and Yb-doped fiber lasers, constitute the most-powerful laser sources available currently. Another possible option for the laser may be a frequency-doubled cryogenically cooled Cr:Forsterite laser, wherein the wavelength of the driver pulse delivered from the Cr:Forsterite laser can be, for example, about 1300 nm, and wherein the second harmonic generator produces a wavelength of, for example, about 650 nm.

FIGS. 1 and 2 show basic schemes of the apparatus. FIG. 1 shows the single-pass configuration. In this configuration, milijoule infrared (IR) pulses 12 (1-100 mJ) are generated from a drive laser 14 (e.g., a seed laser and a regenerative amplifier) at low repetition rate (10 Hz-100 kHz) and are used to generate high-order harmonics of 0.01-1 µJ of EUV energy 20 (with conversion efficiencies of approximately $10^{-5}$ per harmonic) by passing the pulses 12 through a second harmonic generator 16 and gas media 18 comprising, e.g, helium and/or neon. When the pulses 12 pass through the gas medium 18, the energy of the pulse 12 rips electrons off the noble gas atoms; when the electrons recombine with the noble gas atoms, ultraviolet radiation 20 is emitted.

FIG. 2 shows an alternative configuration that uses a resonant cavity 22 in place of the gas media 18. In the configuration of FIG. 2, due to the pulse recycling and enhancement, the efficiency can be boosted by a factor of 1000 and more. A high-repetition-rate system (50-100 MHz) is used with pulses energies of 1-10 µJ, leading to 1-10 mJ intracavity pulses, producing high-order harmonics of 0.01-0.1 µJ of energy with overall conversion efficiencies of approximately 1% per harmonic. Use of both the fundamental and second harmonic pulses in the generation process may be advantageous.

Some of the light sources 14 that can be used in the apparatus can operate in the picosecond regime. In this case, the light sources use pulse compression assisted by self phase modulation in order to achieve pulses shorter than 150 fs. The pulse compression stage can be implemented on the infrared pulse or directly on the visible pulse obtained by second harmonic generation (SHG).

Depending on the configuration, the gas interaction medium 18, shown in FIG. 1, can have different geometries; for example, the gas interaction medium 18 can be a glass capillary with a T-shape or just a tube or a gas cell with two holes through which the laser beam can pass and through which the gas escapes. The gas interaction medium 18 is supplied by a compressed gas source (e.g., a compressed gas tank filled with helium or neon). The length of the gas interaction medium 18 can vary from hundreds of microns up to a few centimeters depending on the focusing condition, pressure and the type of gas used. Considering the amount of gas loaded on the vacuum chamber, piezoelectric pulsed valves can be used for the single-pass/low-repetition-rate scheme; but for a high repetition rate, a continuous gas flow is provided. Differential pumping stages also can be used at the inlet and outlet ports of the gas interaction medium 18 in order to keep the vacuum below $10^{-3}$ Torr at the main chamber of the gas interaction medium 18.

Experimental Exemplification

Applying the saddle point treatment to the dipole acceleration of the improved three step model (ITSM) for HHG and using a top-hat driving beam, we obtained closed analytic formulas for the HHG conversion efficiencies for the plateau and the cutoff region including both laser and material parameters. Single-active-electron (SAE) approximation and one-dimensional propagation effects are also included. The final expression for the efficiency, η, at the cutoff frequency, $\Omega_{cutoff}$, can be written as follows:

$$\eta = 0.0236\frac{\sqrt{2I_p}\,\omega_0^5 |a_{rec}|^2 |g(\Delta k, L)|^2 1-\beta^{4(N-1)}}{E_0^{16/3} \Omega_{cutoff}^2 \sigma^2(\Omega_{cutoff})} \quad (2)$$

$$\frac{1-\beta^{4(N-1)}}{(1-\beta^4)N}|1+\beta|^2 \kappa_0 w[E(tb_{cutoff})],$$

where $g(\Delta k, L)=[e^{i(\Delta k \cdot L)}-e^{-L/(2\cdot L_{abs})}]/[1+2i(\Delta k \cdot L_{abs})]$ is the phase matching form factor, $\Delta k$ is the phase mismatch, and $L_{abs}$ is the absorption length. N is the number of cycles of the driver pulse, and $\beta=|a(\pi/\omega)|^2$, with $|a(t)|^2$ denoting the probability of finding the atom on the ground state. $I_p$ is the ionization potential; $w(E)$ is the ionization rate; and $a_{rec}$ is the recombination amplitude, as written in Eq. (7) of A. Gordon, et al., "Role of Many-Electron Dynamics in High Harmonic Generation," 96 Phys. Rev. Lett. 2239602 (2006). The intracycle depletion of the ground state, $\kappa_0$, is given by $|a(tb_{cutoff})$ $a(ta_{cutoff})|^2$, where the respective birth and arrival times are $tb_{cutoff} \approx 1.88/\omega_0$ and $ta_{cutoff} \approx 5.97/\omega_0$.

In accordance with Equation (2), the efficiency at the cutoff region scales with a factor of $\omega_0^5$. A cubic dependence with $\omega_0$ is due to quantum diffusion. An additional factor of $\omega_0$ comes from the fact that we are considering the conversion efficiency into a single harmonic, and the bandwidth it occupies is $2\omega_0$. The fifth $\omega_0$ comes from the energy carried by a cycle of the driving laser field, which scales with its duration $2\pi/\omega_0$ for a given electric field amplitude.

On the other hand, in the plateau region, each harmonic has contributions from two trajectories and the final expression for the efficiency, $\eta$, in the plateau region is as follows:

$$\eta = 0.0107 \frac{\sqrt{2I_p} \, \omega_0^5 |a_{rec}|^2 |g(\Delta k, L)|^2}{E_0^4 \Omega^2 \sigma^2(\Omega)} \frac{1-\beta^{4(N-1)}}{(1-\beta^4)N} \left|1+\beta e^{i\pi\left(1-\frac{\Omega}{\omega_0}\right)}\right|^2 \times \left|\frac{a(tb_s)a(ta_s)\sqrt{w(E(tb_s))}}{\sin(\omega_0 tb_s)[w_0(ta_s-tb_s)/(2\pi)]^{3/2}} \frac{e^{-i(\overline{S}_s - \Omega ta_s)}}{\sqrt{|\partial_t^2 S_s|}} + \frac{a(tb_l)a(ta_l)\sqrt{w(E(tb_l))}}{\sin(\omega_0 tb_l)[w_0(ta_l-tb_l)/(2\pi)]^{3/2}} \frac{e^{-i(\overline{S}_l - \Omega ta_l - \frac{\pi}{2})}}{\sqrt{|\partial_t^2 S_l|}}\right|^2,$$

where $(tb_s, ta_s)$, $(tb_l, ta_l)$ and $\overline{S}_{s,l} = S(ta_{s,l}, tb_{s,l})$ are the pairs of birth/arrival times and the corresponding semi-classical action for the short and the long trajectory of a particular harmonic, respectively. Equation (3) is valid for harmonic energies, $\Omega$, in the plateau region, satisfying the condition $1 < (\Omega - I_p)/U_p < 3.1$. Notice that Equation (3) has an additional term related to the derivative of the action, $\partial_t^2 S$, which is the atto-chirp, respectively, associated to the long/short trajectory. This leads to additional energy spreading over the harmonics, reducing the power in each by another factor of $\omega_0$. Therefore, in general, the scaling of HHG efficiency with the driving frequency is $\omega_0^5$ at the cutoff, and $\omega_0^6$ in the plateau region for fixed harmonic wavelength.

Figure 4:
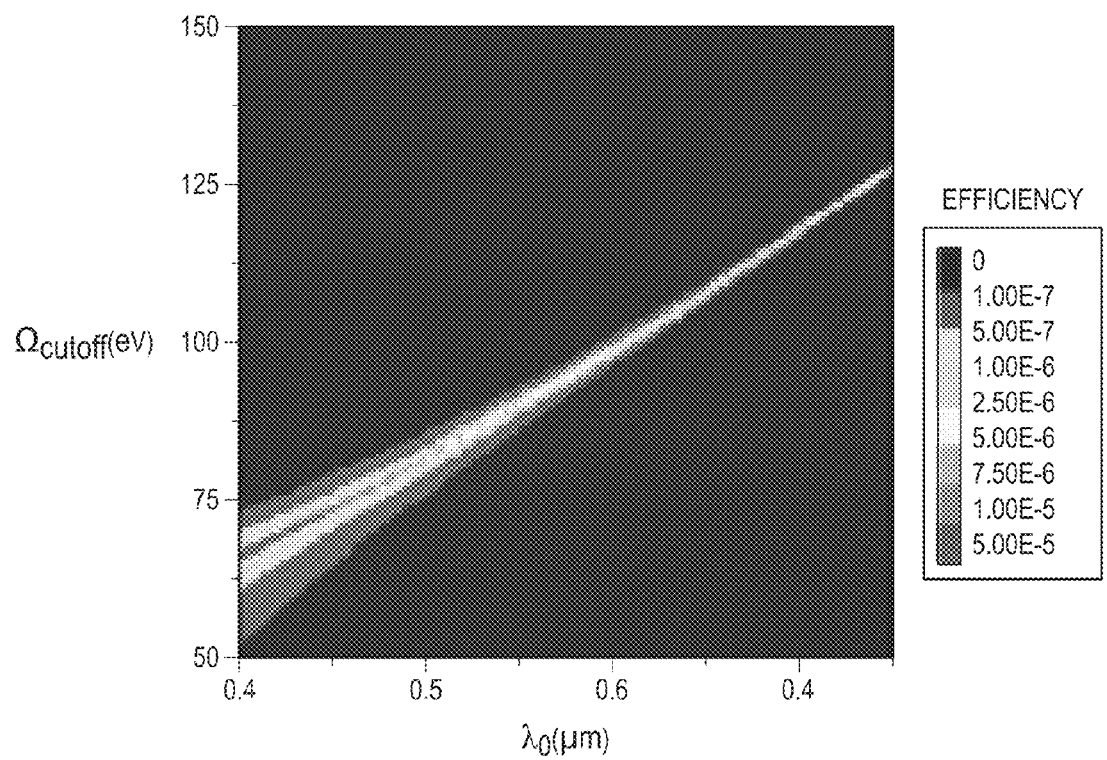
FIG. 4 is a photographic representation of HHG efficiency for helium at the cutoff frequency as a function of driving wavelength, $\lambda_0$, for 18 cycles of the pulse.
Figure 5:
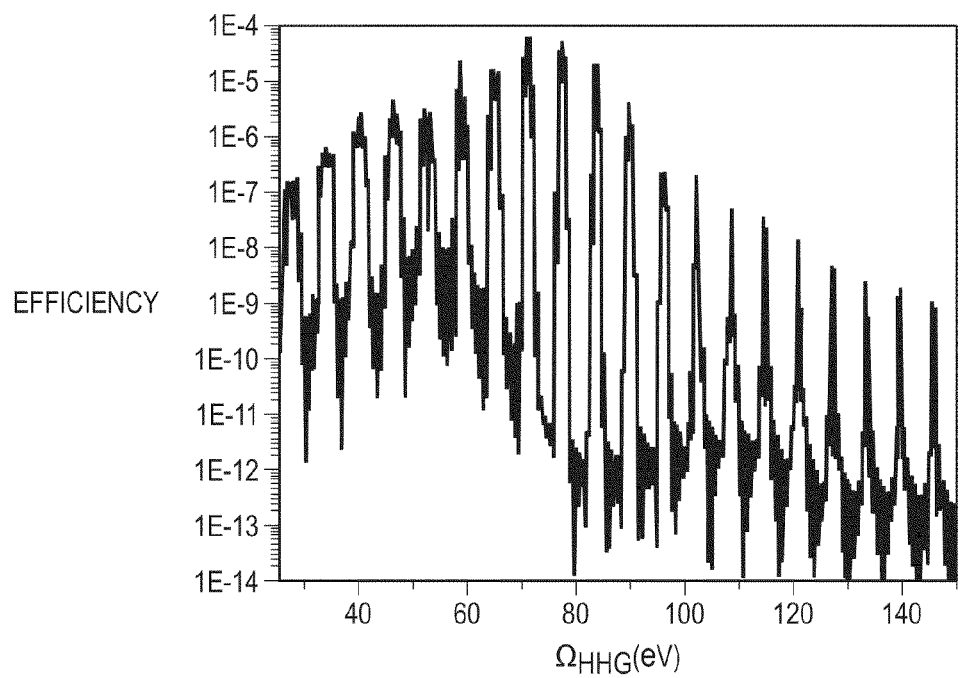
FIG. 5 is a plot of a complete HHG efficiency spectrum in He simulated for Gaussian pulses of $\tau_{FWHM}$=18 cycles, $\lambda_0$=400 nm, p=3 bar, L=2.5 mm, $z_0$=1.25 cm, $I_0$=1.0×10$^{15}$ W/cm$^2$.

Based on Equation (2) and Equation (3), predictions about the HHG efficiency can be performed. FIGS. 3 and 4 show the HHG conversion for a single-pass HHG in He as a function of the driving wavelength, $\lambda_0$, and the cut off frequency. In FIGS. 3 and 4, 5-cycle-driver pulses and 18-cycle-driver pulses are considered, respectively. An interaction length, L, of 5 mm is used in both cases. Related to the phase mismatch, only the plasma and the neutral gas dispersion were taken into account. Clearly, efficiencies of $10^{-5}$ are observed in the energy range of up to 100 eV.

Figure 6:
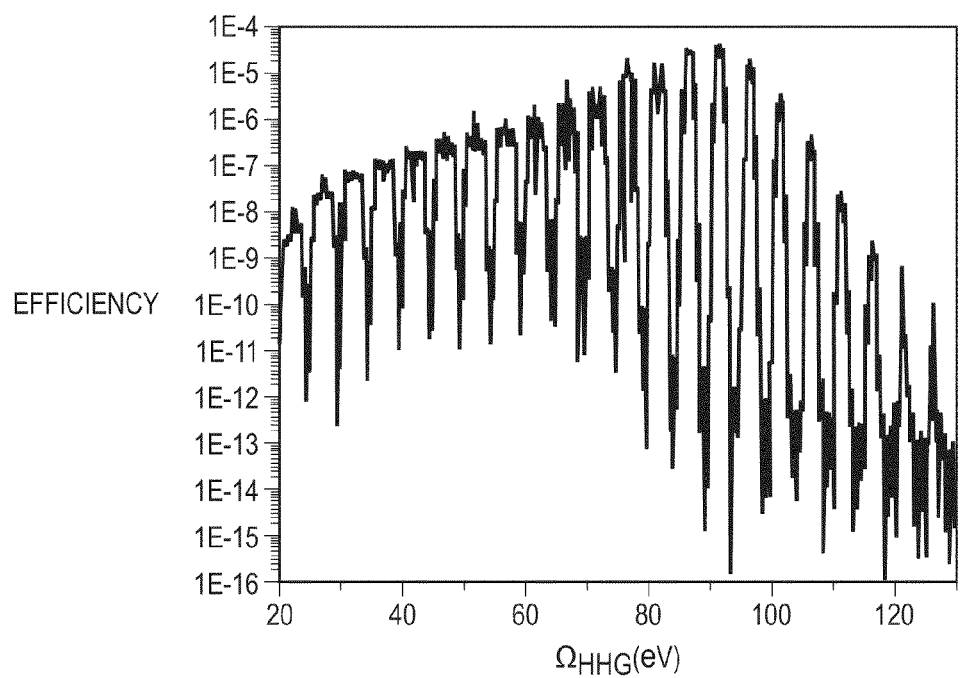
FIG. 6 is a plot of a complete HHG efficiency spectrum in He simulated for Gaussian pulses of $\tau_{FWHM}$=18 cycles, $\lambda_0$=500 nm, p=2 bar, L=5 mm, $z_0$=1.0 cm, $I_0$=8.8×10$^{14}$ W/cm$^2$.

The simulations presented in FIGS. 3 and 4 are corroborated when the complete efficiency spectrum is simulated considering a Gaussian driver pulse and when the Gouy phase shift is included in the phase mismatch term, as shown in FIGS. 5 and 6. In order to enable a direct comparison with the results presented in FIGS. 3 and 4, a loose focusing geometry is a assumed, considering a Rayleigh length, $z_0$, of about 1.0 cm. Actually, as can be observed from the comparison of FIGS. 3 and 4 and FIGS. 5 and 6, the total ionization due to a Gaussian pulse is smaller than with a top-hat pulse. The performance for a more realist pulse like a Gaussian or a sech pulse under a loose focusing geometry can be slightly better than the one presented in FIGS. 3 and 4.

Figure 7:
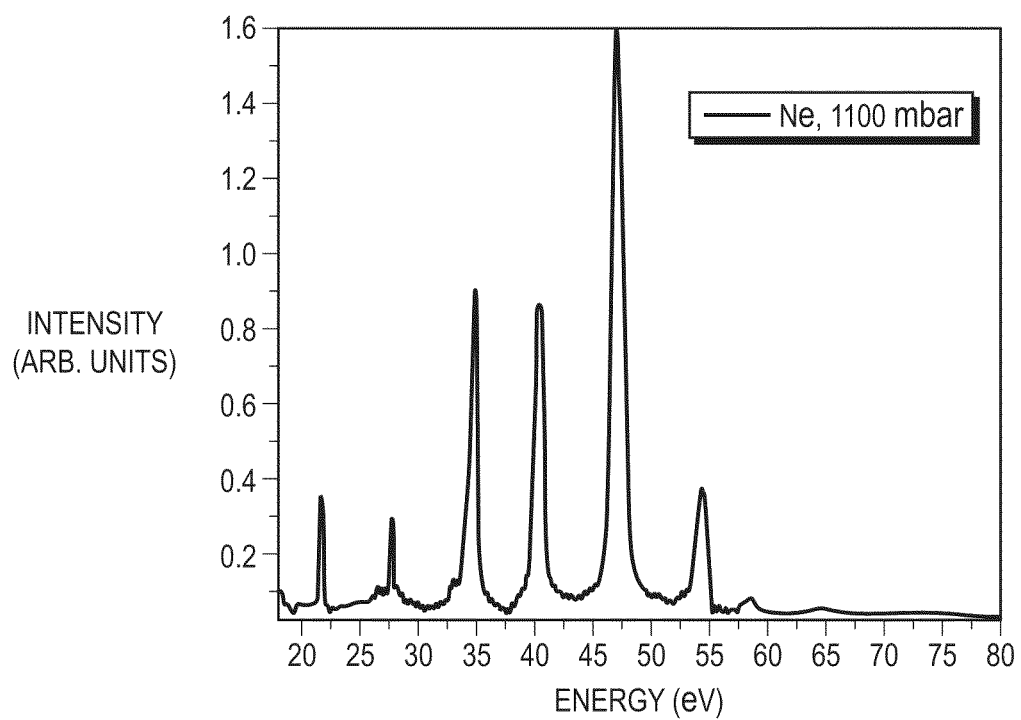
FIG. 7 plots the experimental spectrum of Ne pumped with 0.95 mJ pulses at 400 nm.
Figure 8:
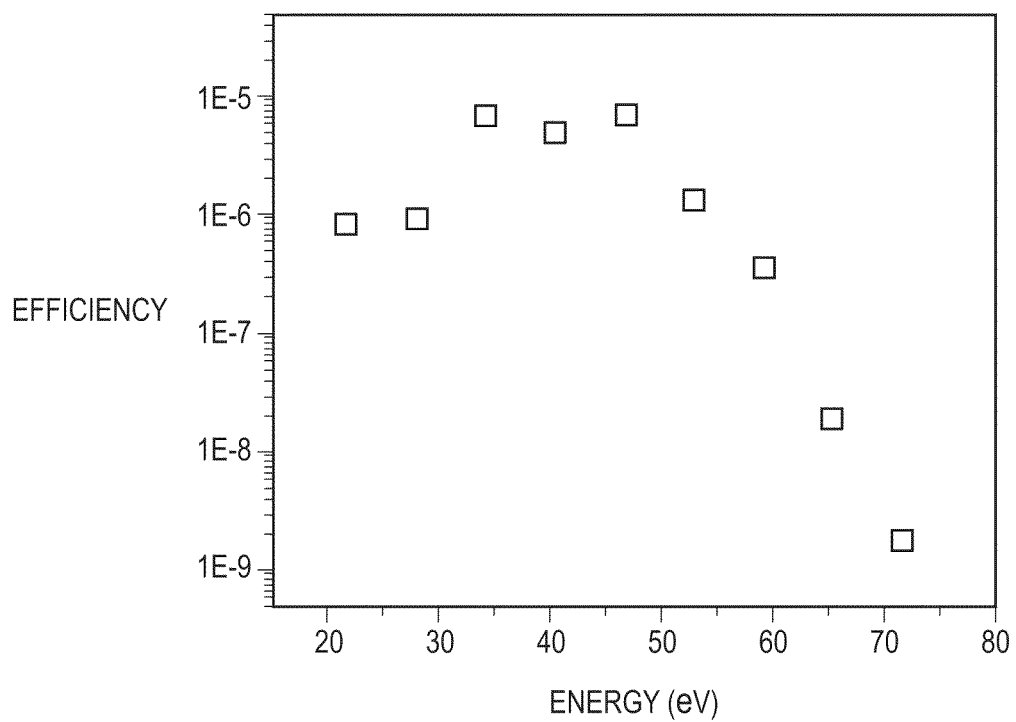
FIG. 8 plots the efficiency values related to the spectrum presented in FIG. 7.
Figure 9:
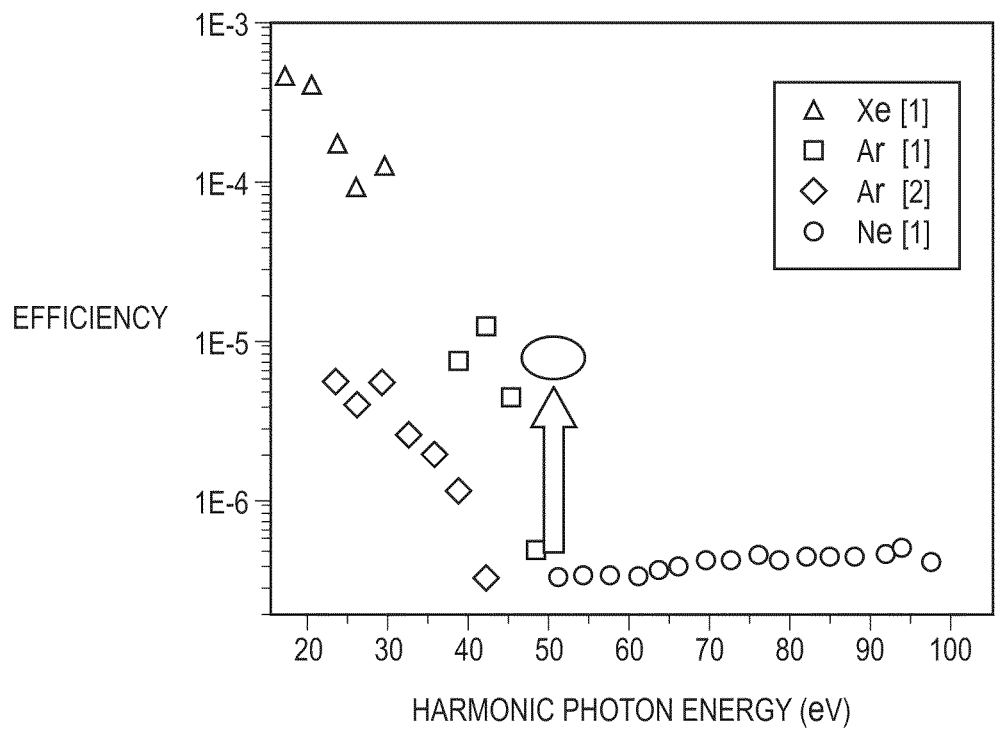
FIG. 9 plots a comparison with some previous results for 800-nm pulses as the HHG driver. The arrow and the ellipse represent the result obtained using 400-nm pulses.

A demonstration experiment was performed with a 400-nm driver pulse obtained by SHG of an amplified Ti:sapphire pulse. A $\beta$-BaB$_2$O$_4$ (BBO) crystal of 150 µm of thickness was used to generate the 400-nm pulses, whose pulse duration is estimated to be around 25 fs, corresponding to an 18-cycle pulse. The spectrum of Ne pumped with 0.95 mJ pulses at 400 nm is presented in FIG. 7 and the respective efficiency values are shown in FIG. 8. FIG. 9 presents a selection of previous results published by other groups using 800 nm as the HHG driver. Clearly, it can be observed that using 400-nm pulses, the HHG conversion efficiency in Ne is increased by two orders of magnitude, and it was possible to achieve efficiencies of $10^{-5}$ for HHG energies of up to 50 eV. This preliminary result was limited due to some physical constraints in the setup, which was limited to a tight focusing geometry with a Raleigh length, $z_0$, of about 2 mm. Such values limit us to a short interaction length and consequently force us to use high pressures. As a consequence, there is not only a strong contribution for the phase mismatch from the plasma and from the Gouy phase shift, but also the high plasma density provokes distortions on the wave front of the driving field. These combined factors are limiting the overall efficiency for high energies. Also, shorter pulses combined with longer driving wavelength, such as 500 nm, can be used, which can improve even more the overall efficiency at high energies.

Figure 10:
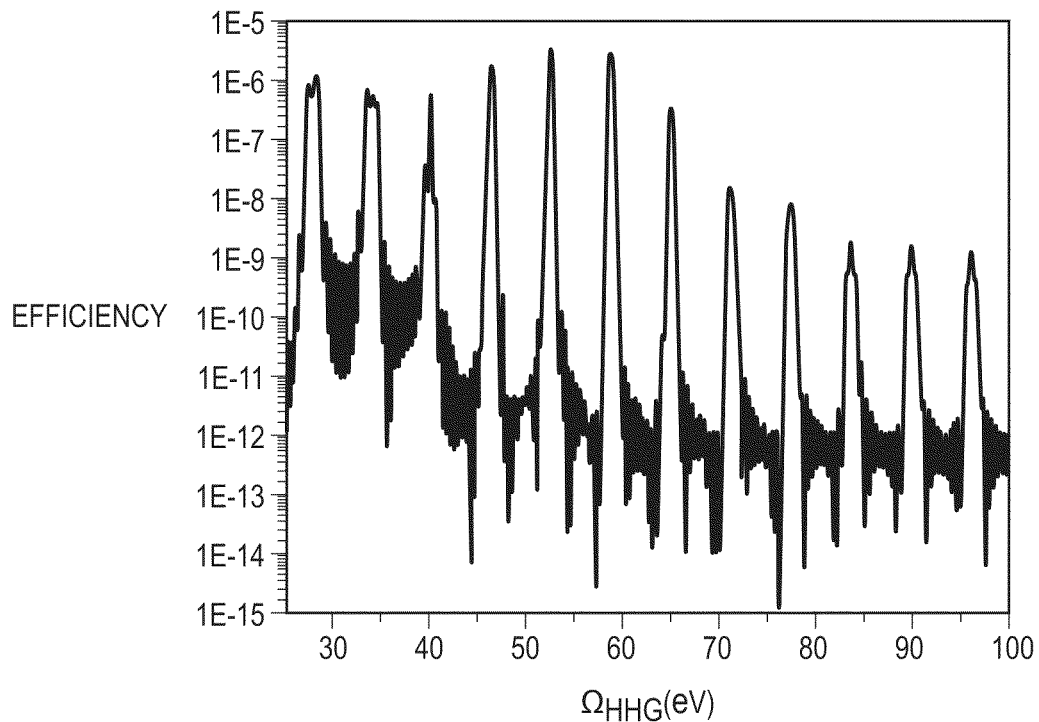
FIG. 10 plots a complete HHG efficiency spectrum in Ne simulated considering Gaussian pulses, where $\lambda_0$=400 nm, p=1.1 bar, L=1 cm, $z_0$=8 cm, $\tau_{FWHM}$=18 cycles, and $I_0$=6.0×10$^{14}$ W/cm$^2$ FIG. 11 plots a complete HHG efficiency spectrum in Ne simulated considering Gaussian pulses, where $\lambda_0$=400 nm, p=1.1 bar, L=1 cm, $z_0$=8 cm, $\tau_{FWHM}$=5 cycles, $I_0$=8.0×10$^{14}$ W/cm$^2$.
Figure 11:
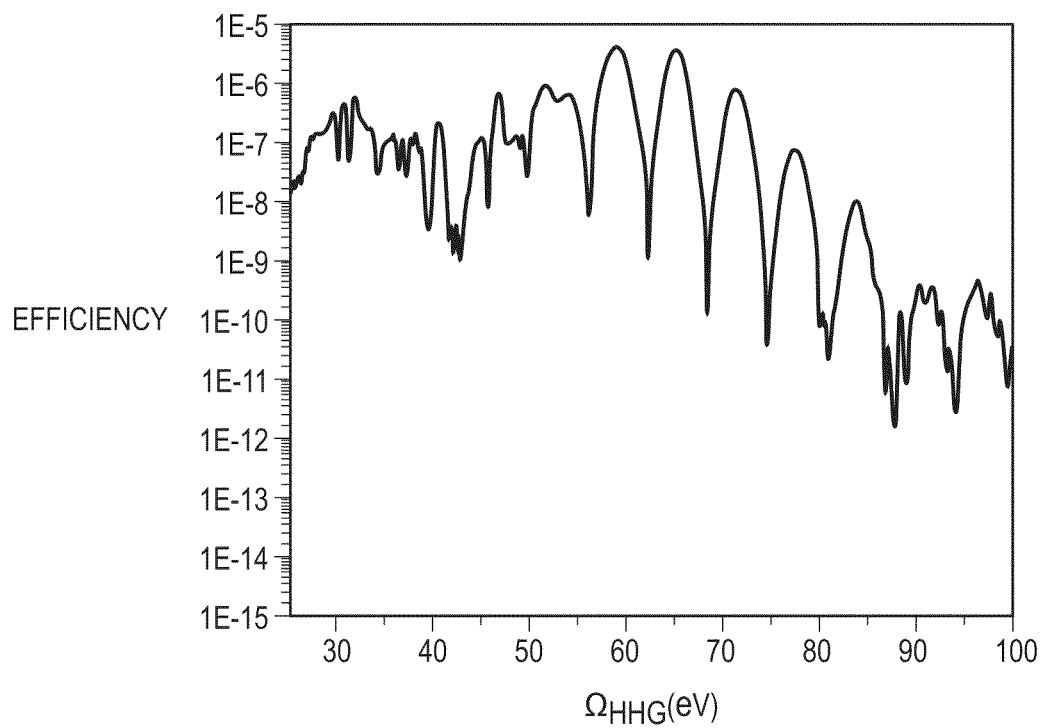

Numerical simulations for Ne are presented in FIGS. 10 and 11 considering Gaussian pulses, a driver wavelength of 400 nm, a gas pressure of 1.1 bar, an interaction length of 1 cm and a Rayleigh length of about 8 cm. Thus, although high efficiencies were obtained in our experimental results for Ne around 50 eV, our simulations lead us to predict that under better experimental conditions, the range of higher efficiencies in Ne can be extended up to 59 eV for an 18-cycle pulse, FIG. 10, and up to 65 eV for a 5-cycle pulse, FIG. 11.

For multi-pass HHG using the cavity enhancement technique, an apparatus is used with an advantageous choice of laser wavelength and cavity design to enable efficient EUV/XUV generation via HHG. Such a design can be especially provided for the generation of the important 13.5-nm radiation expected to be used for EUVL, or any other particular EUV wavelength of interest above 10 nm. For example, for efficient 13.5-nm-radiation generation via HHG, the optimum wavelength is close to 500 nm (i.e., the second harmonic of 1 micron, where the most powerful ultrashort pulse lasers exist), enables reach of output powers for EUVL. The efficiency of the process is boosted by the use of pulse recycling and pulse enhancement via a resonant cavity. As a consequence of this field enhancement, high intracavity field intensities are expected, which can lead to mirror damage. In order to solve the cavity mirror damage problem, a Bessel-Gauss resonator can be used.

The Fourier transform of an ideal Bessel function of zero order, $J_0(\alpha \cdot r)$, is a (circular) delta Dirac function. Thus, the distribution of the spatial frequencies associated to a Bessel beam is given by $\alpha^{-1} \cdot \delta(v_\rho - v_\alpha)$, where $v_\rho$ is the (radial) spatial frequency and $v_\alpha \equiv \alpha/2\pi$. In other words, since the far-field intensity distribution is directly related to the spatial frequency spectrum, one should observe a thin circular ring of intensity in the far field of a Bessel beam. Bessel beams, at the near field, are of infinite extent and carry infinite power. Therefore, Bessel beams of only finite extent can be realized in practice. Bessel-Gauss beams are characterized by a Bessel function of real argument with a Gaussian envelope. Thus, the Bessel-Gauss beams usually contain only a few rings in the radial intensity distribution in the near field, corresponding at the far field to a finite ring with a certain width. In this way, considering a confocal cavity exhibiting a ring pattern at the reflective mirrors and a finite Bessel profile at the focus, one may not only distribute the intracavity pulse energy better over the area of the cavity mirror but also enable direct output coupling of the EUV radiation through a central opening in the mirror.

Figure 12:
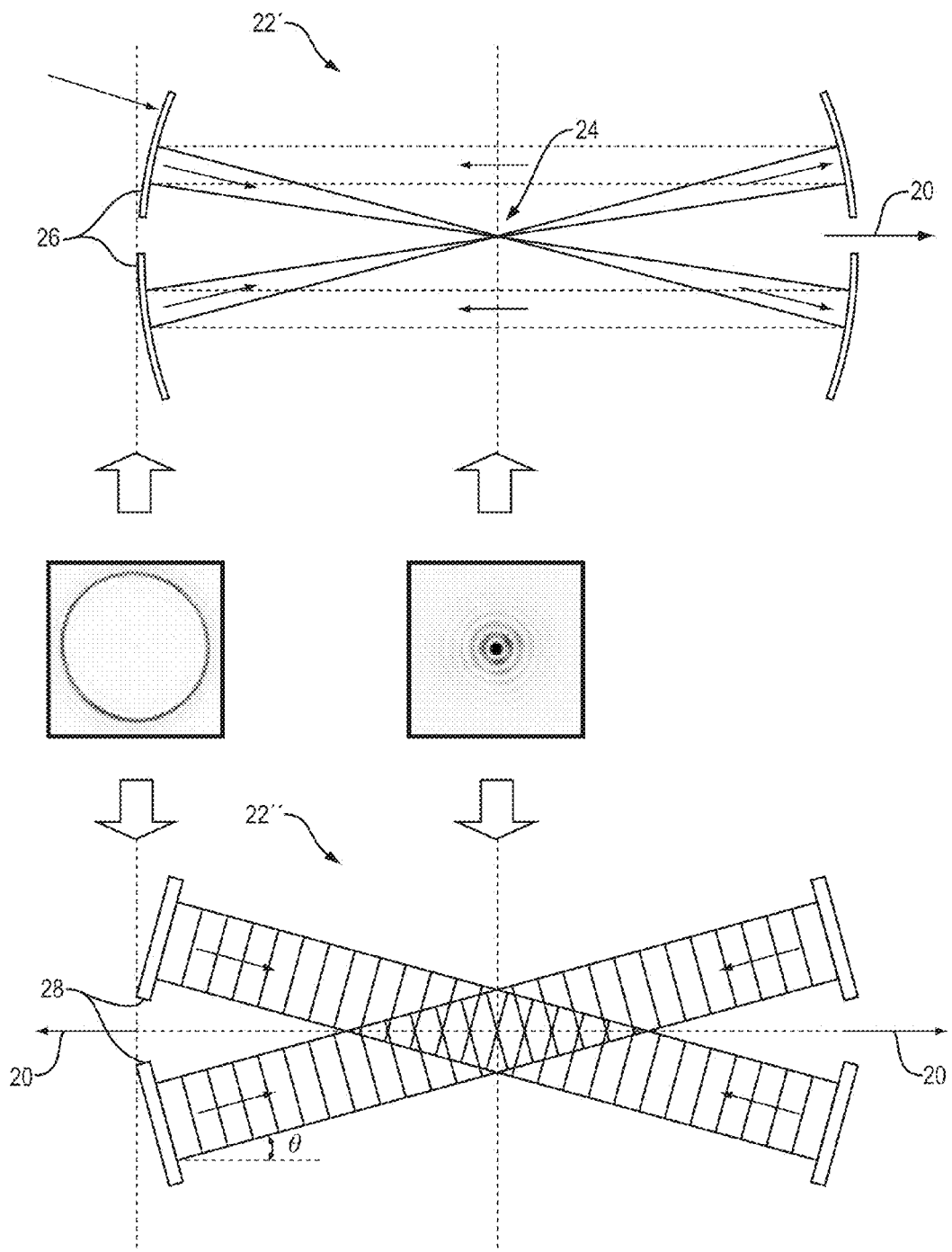
FIG. 12 provides a schematic representation of two different Bessel-Gauss resonators for cavity-enhancement HHG: at top, using a cavity built with a pair of spherical mirrors and with a single EUV output port and, at bottom, using a cavity based on reflective axicons with two EUV output ports.

FIG. 12 shows two different Bessel-Gauss cavities 22 that can be used for cavity enhanced HHG, e.g., in the configuration of FIG. 2. with the beam profile at the mirrors 26/28 and at the focus 24 of the cavity 22 at the cavity midpoint shown in between. Both cavities 22 are confocal. The repetition rate of the cavity 22 is matched to the repetition rate of the drive laser to make it resonant. Since the cavity mirrors are only used on a ring, their inner part can be removed, and that is where the EUV radiation can be coupled out of the cavity. In the top cavity 22', spherical cavity mirrors 26 are used, where the highly reflective area is a ring with a certain width, $\Delta r$. Another possible geometry for the cavity is presented in the bottom cavity 22"; in this configuration, conical mirrors 28 (reflective axicons) are used to build the cavity. A gas nozzle is provided to inject a noble gas at the focus 24 of the cavity 22 to generated the EUV radiation 20 when intersected with the beam, as in the single-pass configuration of FIG. 1.

Provided the similarities between these two cavities 22, notice that the modes supported for them are slightly different, as indicated by the arrows representing the light propagation between the mirrors. As a consequence, the top cavity 22' has only one EUV output 20 while the bottom cavity 22" can have two EUV outputs 20. The geometrical properties of the mirrors 26/28 used in these cavities 22, such as the angle, $\theta$, and width, $\Delta r$, are determined for optimal HHG generation, for single-mode operation of the cavity 22 and for maximum distribution of the laser pulses energy over an area as large as possible on the mirrors 26/28, which is the ring. Additional description of Bessel-Gauss cavities is provided in U.S. Ser. No. 12/894,620, which has overlapping inventorship with this filing.

Figure 13:
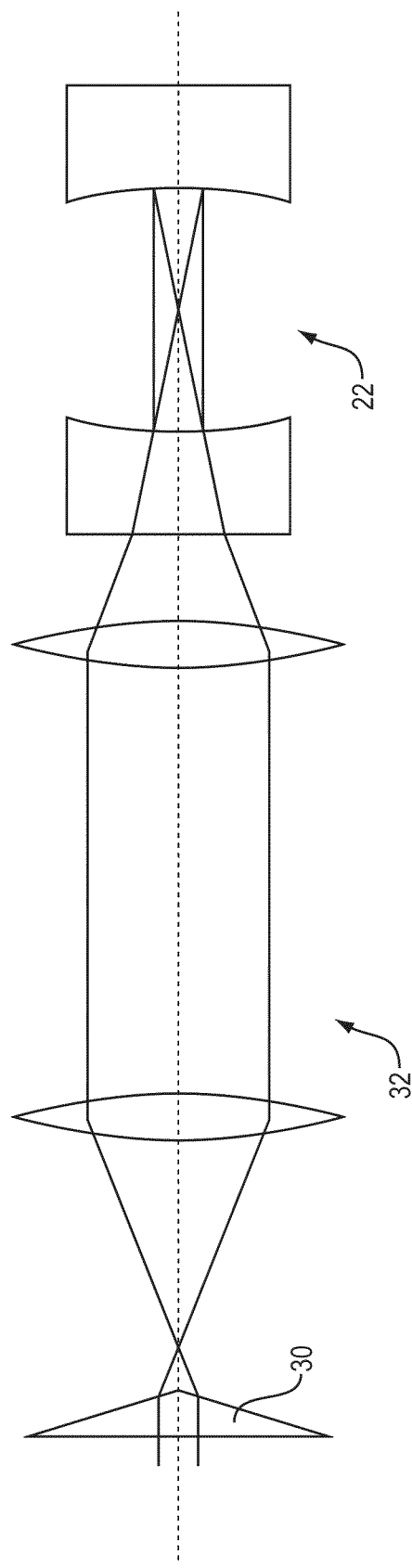
FIG. 13 is a schematic representation of a possible mode matcher for minimization of the coupling losses between the driver laser mode and the Bessel-Gauss cavity mode.

In order to avoid mode coupling losses, the drive laser mode is matched to the Bessel-Gauss cavity mode. An example of such a mode matcher is provided in FIG. 13. The first step is to convert a Gaussian beam into an annulus via an axicon 30. Then, using a telescope 32, the mode matching can be performed, changing the telescope parameters.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Further, where parameters for various properties are specified herein for embodiments of the invention, those parameters can be adjusted up or down by $1/100^{th}$, $1/50^{th}$, $1/20^{th}$, $1/10^{th}$, $1/5^{th}$, $1/3^{rd}$, $1/2$, $3/4^{th}$, etc. (or up by a factor of 2, 5, 10, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety; and appropriate components, steps, and characterizations from these references optionally may or may not be included in embodiments of this invention. Appropriate components and methods of those references may be selected for the invention and embodiments thereof. Still further, the components and methods identified in the Background section are integral to this disclosure and can be used in conjunction with or substituted for components and methods described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A method for efficient generation of extreme ultraviolet radiation based on high-order harmonic generation, comprising:
    generating an infrared driver pulse from a drive laser;
    passing the infrared driver pulse through a second harmonic generator with an output wavelength in a range from 400 to 700 nm; and then
    passing the pulse through a gas medium that comprises at least one gas selected from neon and helium inside a Bessel-Gauss resonator to generate a high-order harmonic in the form of extreme ultraviolet radiation.

2. The method of claim 1, wherein the driver pulse has an energy in a range from 100 µJ to 100 mJ inside the resonant cavity.

3. The method of claim 1, wherein the driver pulse has a repetition rate greater than 100 kHz.

4. The method of claim 1, wherein the driver pulse has an energy in a range from 1-10 µj before entering the resonant cavity.

5. The method of claim 1, wherein the driver pulse has a repetition rate in a range from 50-100 MHz.

6. The method of claim 1, wherein the wavelength of the driver pulse is about 1 µm, and wherein the second harmonic generator produces a wavelength of about 500 nm.

7. The method of claim 6, wherein the generated high-order harmonic has a wavelength of about 13.5 nm.

8. The method of claim 1, wherein the extreme ultraviolet radiation is spatially and temporally fully coherent.

9. The method of claim 1, further comprising directing a pattern of the extreme ultraviolet radiation onto a photosensitive surface to perform lithography.

10. The method of claim 1, wherein the wavelength of the driver pulse is about 1300 nm delivered from a Cr:Forsterite laser, and wherein the second harmonic generator produces a wavelength of about 650 nm.

11. An efficient high-harmonic-generation-based extreme ultraviolet radiation source driven by short wavelength light comprising:
    a laser configured to emit optical pulses along a path;
    a second harmonic generator positioned in the path of the optical pulses with output wavelength in a range from 400 to 700 nm; and
    an extreme ultraviolet radiation generator including a Bessel-Gauss cavity containing a gas medium comprising at least one gas selected from neon and helium positioned in the path of the optical pulses on an opposite side of the second harmonic generator from the laser.

12. The extreme ultraviolet radiation source of claim 11, wherein the laser is selected from a titanium:sapphire laser, an ytterbium-based solid-state or fiber laser, and a Cr:Forsterite laser.

13. The extreme ultraviolet radiation source of claim 11, wherein the second harmonic generator includes $\beta$-$BaB_2O_4$.

* * * * *